(12) United States Patent
Ishibashi

(10) Patent No.: US 12,394,639 B2
(45) Date of Patent: Aug. 19, 2025

(54) SUBSTRATE DRYING DEVICE AND SUBSTRATE DRYING METHOD

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 622 days.

(21) Appl. No.: 17/850,309

(22) Filed: Jun. 27, 2022

(65) Prior Publication Data

US 2023/0005762 A1  Jan. 5, 2023

(30) Foreign Application Priority Data

Jun. 29, 2021 (JP) ................................. 2021-107175

(51) Int. Cl.
   *H01L 21/67* (2006.01)
   *H01L 21/66* (2006.01)

(52) U.S. Cl.
   CPC .. *H01L 21/67034* (2013.01); *H01L 21/67051* (2013.01); *H01L 22/30* (2013.01)

(58) Field of Classification Search
   CPC ......... H01L 21/67034; H01L 21/67051; H01L 22/30
   See application file for complete search history.

(56) References Cited

U.S. PATENT DOCUMENTS

| | | | | |
|---|---|---|---|---|
| 5,520,744 A | * | 5/1996 | Fujikawa | H01L 21/67028 257/E21.228 |
| 5,575,079 A | * | 11/1996 | Yokomizo | H01L 21/67034 34/470 |
| 5,657,553 A | * | 8/1997 | Tarui | F26B 3/30 34/477 |
| 6,354,311 B1 | * | 3/2002 | Kimura | H01L 21/67034 134/61 |
| 6,401,361 B1 | * | 6/2002 | Chen | H01L 21/67253 34/570 |
| 7,644,512 B1 | * | 1/2010 | Liu | H01L 21/67028 34/80 |
| 2006/0042722 A1 | * | 3/2006 | Kim | H01L 21/67051 141/100 |
| 2011/0289795 A1 | * | 12/2011 | Ishibashi | H01L 21/67034 34/467 |
| 2017/0252894 A1 | * | 9/2017 | Miyazaki | H01L 21/67739 |

FOREIGN PATENT DOCUMENTS

| | | |
|---|---|---|
| JP | H05-291233 | 11/1993 |
| JP | 2006-013507 A | 1/2006 |
| JP | 2008-119565 A | 5/2008 |
| JP | 2011-192967 A | 9/2011 |
| JP | 2015-006478 A | 4/2015 |

* cited by examiner

*Primary Examiner* — Seahee Hong
(74) *Attorney, Agent, or Firm* — Leydig, Voit & Mayer, Ltd.

(57) ABSTRACT

A substrate drying device is provided that can suppress occurrence of a micro size defect (for example, a defect having a defect size of 20 nm or less). A substrate drying device 1 includes a substrate holding unit 11 which holds a substrate W, a gas generator 60 which generates a drying gas G including at least IPA vapor and for drying the substrate W, and a drying gas nozzle 30 which supplies the drying gas G to the surface WA of the substrate W. A filter 67 for filtering the drying gas G is provided in the gas generator 60. A defect size D allowed in a defect test after the drying of the substrate W is set to 20 nm or less and a ratio D/F of the defect size D and a filter size F of the filter 67 is set to 4 or more.

1 Claim, 6 Drawing Sheets

FIG. 4

| | W1 | W2 | W3 | W4 |
|---|---|---|---|---|
| RINSE LIQUID | | | | |
| IPA CONCENTRATION | | | | |
| GAS AMOUNT | | | | |
| NUMBER OF REVOLUTIONS OF SUBSTRATE | | | | |

FIG. 5

| RATIO (D/F) OF DEFECT SIZE D AND FILTER SIZE F | EFFECT OF SUPPRESSING DEFECT OCCURRENCE |
|---|---|
| 67 | PRESENT |
| 20 | PRESENT |
| 13 | PRESENT |
| 6 | PRESENT |
| 4 | PRESENT |
| 1.9 | ABSENT |

FIG. 6

| | W1 | W2 | W3 | W4 |
|---|---|---|---|---|
| RINSE LIQUID | | | | |
| IPA CONCENTRATION | | | | |
| GAS AMOUNT | | | | |
| NUMBER OF REVOLUTIONS OF SUBSTRATE | | | | |

FIG. 7

| | W1 | W2 | W3 | W4 |
|---|---|---|---|---|
| RINSE LIQUID | | | | |
| IPA CONCENTRATION | | | | |
| GAS AMOUNT | | | | |
| NUMBER OF REVOLUTIONS OF SUBSTRATE | | | | |

| | W1 | W2 | W3 | W4 |
|---|---|---|---|---|
| RINSE LIQUID | | | | |
| IPA CONCENTRATION | | | | |
| GAS AMOUNT | | | | |
| NUMBER OF REVOLUTIONS OF SUBSTRATE | | | | |

…

SUBSTRATE DRYING DEVICE AND SUBSTRATE DRYING METHOD

BACKGROUND OF THE INVENTION

Field of the Invention

The present invention relates to a substrate drying device and a substrate drying method and, more particularly, to a substrate drying device and a substrate drying method for moving rinse liquid to the outer peripheral side with a centrifugal force and a Marangoni force to gradually expand a drying region on a substrate from the center to the outer periphery and finally drying an entire substrate surface.

Description of the Related Art

According to the refining of semiconductor devices in recent years, various material films having different physical properties have been formed on a substrate and machined. In particular, in a damascene wire forming process, a wiring groove formed on a substrate is buried with metal. However, excess metal is polished and removed by a substrate polishing device (a CMP device) after damascene wire formation, whereby films having different wetting properties to water such as a metal film, a barrier film, and an insulating film are present on a substrate surface. For example, a Low-k film having a low k value is used for an insulating film embedded with copper. However, since the Low-k film is hydrophobic, a water film on a substrate is easily divided. If drying is performed in a state in which the water film is divided, a defect such as a water mark (a water smear) easily occurs. Further, on these substrate surfaces, a residue of slurry used in CMP polishing and foreign matters such as a Cu polishing sludge are present. On a substrate surface having a complicated film shape and a surface property for which cleaning is difficult, if sufficient cleaning is not performed, a leak occurs from a portion of a residue or the like and a problem in reliability could be caused by defective adhesion.

Therefore, as a drying device and a drying method effective for occurrence of a defect, there has been proposed a technique for supplying rinse liquid for cleaning from a rinse liquid nozzle to a substrate rotating in a sheet type to form a liquid film covering an entire substrate surface and supplying a gas current for drying containing IPA (isopropyl alcohol) for reducing surface tension of the rinse liquid from a drying gas nozzle to a substrate to dry the substrate. As such related art, there has been proposed a substrate drying device that can suppress occurrence of a defect even if rinse liquid evaporates in a center area of a substrate where a centrifugal force is relatively small and the rinse liquid easily remains (see, for example, Japanese Patent Application Laid-Open No. 2011-192967 (Patent Literature 1)).

In recent years, with micro size defect grasping involved in high performance of a defect test device (a Defect test device) involved in the progress of microdevices, a defect not grasped in the past has been grasped. A more improved technique that can cope with an obvious problem and an inherent risk has been required.

According to the technological innovation in a semiconductor manufacturing process, in recent years, refining of a line width of a pattern formed on a substrate has been advanced. Particles on the substrate considered nonfatal particles in the past have been considered a cause of a yield. In addition, when many layers of patterns are stacked by a 3D wiring technique or the like, there is also a concern that variation of a surface due to insignificant particles on a substrate surface after substrate polishing is amplified. Therefore, a more improved technique has been demanded. In this way, as the technological innovation is advanced, higher quality has been requested in terms of to which degree particles remaining on the substrate after being dried can be reduced through cleaning treatment, for example, after the substrate is polished.

However, in the substrate drying device and the substrate drying method of the related art, it is difficult to sufficiently suppress occurrence of a micro size defect (for example, a defect with a defect size of 20 nm or less) requested at a higher level according to the latest technological innovation. Further improvement has been requested.

SUMMARY OF THE INVENTION

The present invention has been devised in view of the problems described above and an object of the present invention is to provide a more improved substrate drying device and a more improved substrate drying method that can suppress occurrence of a micro size defect (for example, a defect having a defect size of 20 nm or less).

A substrate drying device of the present invention includes: a substrate holding unit configured to hold a substrate; a gas generator configured to generate a drying gas including at least IPA vapor and for drying the substrate; and a drying gas nozzle configured to supply the drying gas to a surface of the substrate. A filter for filtering the drying gas is provided in the gas generator. A defect size D allowed in a defect test after the drying of the substrate is set to 20 nm or less and a ratio D/F of the defect size D and a filter size F of the filter is set to 4 or more.

With this configuration, even when the defect size D allowed in the defect test after the drying of the substrate is 20 nm or less, it is possible to suppress occurrence of a defect (a defect having the defect size D of 20 nm or less) by setting the ratio of the defect size D and the filter size F of the filter (the filter for filtering the drying gas for drying the substrate). Therefore, it is possible to provide a more improved substrate drying device that suppresses occurrence of a micro size defect on the entire substrate.

A substrate drying device of the present invention is a substrate drying device including: a substrate holding unit configured to hold a substrate; a substrate rotating unit configured to rotate the substrate holding unit; a rinse liquid supply mechanism including a rinse liquid nozzle for supplying rinse liquid to a surface of the substrate; a gas generator configured to generate a drying gas including at least IPA vapor and for drying the substrate; a drying gas supply mechanism including a drying gas nozzle for supplying the drying gas to the surface of the substrate; a nozzle moving mechanism for moving, according to drying treatment for the substrate, a supply position of the drying gas from the drying gas nozzle and a supply position of the rinse liquid from the rinse liquid nozzle; and a control device configured to control operations of the substrate rotating unit, the nozzle moving mechanism, the rinse liquid supply mechanism, the gas generator, and the drying gas supply mechanism. When the surface of the substrate is concentrically divided into a center area where a rotation center of the substrate is present, an inner peripheral area present on an outer side of the center area, an outer peripheral area present on an outer side of the inner peripheral area, and a peripheral edge area located on an outermost periphery of the substrate, the control device operates to perform all of following controls of (1), (2), and (3) for the substrate drying device while rotating the substrate with the substrate rotating unit. The control device (1) controls the rinse liquid supply mechanism to supply the rinse liquid from the rinse liquid nozzle to the surface of the substrate when the rinse liquid nozzle is located in the center area where the rotation center of the substrate is present, the inner peripheral area, or the outer peripheral area and stop supplying the rinse liquid from the rinse liquid nozzle to the surface of the substrate when the rinse liquid nozzle is located in the peripheral edge area, (2) controls the gas generator to set concentration of a drying component included in the drying gas supplied from the drying gas nozzle to the surface of the substrate higher when the drying gas nozzle is located in the inner peripheral area or the outer peripheral area compared with when the drying gas nozzle is located in the center area and set the concentration of the drying component included in the drying gas supplied from the drying gas nozzle to the surface of the substrate to zero when the drying gas nozzle is located in the peripheral edge area, and (3) controls the drying gas supply mechanism to supply the drying gas from the drying gas nozzle to the surface of the substrate when the drying gas nozzle is located in the center area, the inner peripheral area, or the outer peripheral area and reduce a flow rate of the drying gas supplied from the drying gas nozzle to the surface of the substrate when the drying gas nozzle is located in the peripheral edge area.

With this configuration, when the drying gas nozzle reaches the position of the peripheral edge area of the substrate, the supply of the rinse liquid from the rinse liquid nozzle to the surface of the substrate is stopped, the concentration of the drying component (IPA) included in the drying gas supplied from the drying gas nozzle to the surface of the substrate is set to zero, and the flow rate of the drying gas is reduced. Consequently, it is possible to suppress occurrence of a defect (a defect having the defect size D of 20 nm or less) in the peripheral edge area (an edge portion) of the substrate where defect occurrence tends to be a problem. Therefore, it is possible to provide a more improved substrate drying device that suppresses occurrence of a micro size defect in the entire substrate.

A substrate drying device of the present invention is a substrate drying device including: a substrate holding unit configured to hold a substrate; a substrate rotating unit configured to rotate the substrate; a rinse liquid nozzle configured to supply rinse liquid for covering the substrate with a liquid film to a surface of the substrate; a drying gas nozzle configured to supply a drying gas including at least IPA vapor to the surface of the substrate; a nozzle moving mechanism for moving a supply position of the drying gas from the drying gas nozzle and a supply position of the rinse liquid from the rinse liquid nozzle; a gas generator configured to generate the drying gas for drying the substrate; and a control device configured to control a supply amount of the rinse liquid supplied from the rinse liquid nozzle to the surface of the substrate, concentration of a drying component included in the drying gas supplied from the drying gas nozzle to the surface of the substrate, and a flow rate of the drying gas supplied from the drying gas nozzle to the surface of the substrate. The substrate includes a center area where a rotation center of the substrate is present, an inner peripheral area present on an outer side of the center area, an outer peripheral area present on an outer side of the inner peripheral area, and a peripheral edge area present on an outer side of the outer peripheral area. The control device performs control to supply the rinse liquid from the rinse liquid nozzle to the surface of the substrate when the rinse liquid nozzle is located in the center area, the inner peripheral area, or the outer peripheral area and stop supplying the rinse liquid from the rinse liquid nozzle to the surface of the substrate when the rinse liquid nozzle is located in the peripheral edge area. The control device further performs control to set the concentration of the drying component included in the drying gas supplied from the drying gas nozzle to the surface of the substrate higher when the drying gas nozzle is located in the inner peripheral area or the outer peripheral area compared with when the drying gas nozzle is located in the center area and set the concentration of the drying component included in the drying gas supplied from the drying gas nozzle to the surface of the substrate to zero when the drying gas nozzle is located in the peripheral edge area. The control device further performs control to supply the drying gas from the drying gas nozzle to the surface of the substrate when the drying gas nozzle is located in the center area, the inner peripheral area, or the outer peripheral area and not to change the flow rate of the drying gas supplied from the drying gas nozzle to the surface of the substrate when the drying gas nozzle is located in the peripheral edge area.

With this configuration, when the drying gas nozzle reaches the position of the peripheral edge area of the substrate, the supply of the rinse liquid from the rinse liquid nozzle to the surface of the substrate is stopped, the concentration of the drying component (IPA) included in the drying gas supplied from the drying gas nozzle to the surface of the substrate is set to zero, and the flow rate of the drying gas is not changed. Consequently, it is possible to suppress occurrence of a defect (a defect having the defect size D of 20 nm or less) in the peripheral edge area (an edge portion) of the substrate where defect occurrence tends to be a problem. Therefore, it is possible to provide a more improved substrate drying device that suppresses occurrence of a micro size defect in the entire substrate.

The substrate drying device of the present invention may include a rotating-speed control unit configured to control rotating speed of the substrate by the substrate rotating unit. When the supply of the rinse liquid is stopped, the rotating-speed control unit may increase the rotating speed of the substrate to predetermined target rotating speed at predetermined rotation acceleration or more.

With this configuration, when the supply of the rinse liquid is stopped, by increasing the rotating speed of the substrate to the predetermined target rotating speed at the predetermined rotation acceleration or more, it is possible to suppress occurrence of a defect (a defect having the defect size D of 20 nm or less) in the peripheral edge area (an edge portion) of the substrate where defect occurrence tends to be a problem. Therefore, it is possible to provide a more improved substrate drying device that suppresses occurrence of a micro size defect in the entire substrate.

A substrate drying method of the present invention is a method of drying a substrate using a substrate drying device, the substrate drying device including: a substrate rotating unit configured to rotate a substrate held by a substrate holding unit; a rinse liquid nozzle configured to supply rinse liquid for covering the substrate with a liquid film to a surface of the substrate; and a drying gas nozzle configured to supply a drying gas including at least IPA vapor and for drying the substrate to the surface of the substrate. The substrate includes a center area where a rotation center of the substrate is present, an inner peripheral area present on an outer side of the center area, an outer peripheral area present on an outer side of the inner peripheral area, and a peripheral edge area present on an outer side of the outer peripheral area. The method includes: supplying the rinse liquid from the rinse liquid nozzle to the surface of the substrate when the rinse liquid nozzle is located in the center area, the inner peripheral area, or the outer peripheral area; stopping supplying the rinse liquid from the rinse liquid nozzle to the surface of the substrate when the rinse liquid nozzle is located in the peripheral edge area; setting concentration of a drying component included in the drying gas supplied from the drying gas nozzle to the surface of the substrate higher when the drying gas nozzle is located in the inner peripheral area or the outer peripheral area compared with when the drying gas nozzle is located in the center area; setting the concentration of the drying component included in the drying gas supplied from the drying gas nozzle to the surface of the substrate to zero when the drying gas nozzle is located in the peripheral edge area; supplying the drying gas from the drying gas nozzle to the surface of the substrate when the drying gas nozzle is located in the center area, the inner peripheral area, or the outer peripheral area; and reducing a flow rate of the drying gas supplied from the drying gas nozzle to the surface of the substrate when the drying gas nozzle is located in the peripheral edge area.

With this method as well, as in the device explained above, when the drying gas nozzle reaches the position of the peripheral edge area of the substrate, the supply of the rinse liquid from the rinse liquid nozzle to the surface of the substrate is stopped, the concentration of the drying component (IPA) included in the drying gas supplied from the drying gas nozzle to the surface of the substrate is set to zero, and the flow rate of the drying gas is reduced. Consequently, it is possible to suppress occurrence of a defect (a defect having the defect size D of 20 nm or less) in the peripheral edge area (an edge portion) of the substrate where defect occurrence tends to be a problem. Therefore, it is possible to provide a more improved substrate drying method that suppresses occurrence of a micro size defect in the entire substrate.

A substrate drying method of the present invention is a method of drying a substrate using a substrate drying device, the substrate drying device including: a substrate rotating unit configured to rotate a substrate held by a substrate holding unit; a rinse liquid nozzle configured to supply rinse liquid for covering the substrate with a liquid film to a surface of the substrate; and a drying gas nozzle configured to supply a drying gas including at least IPA vapor and for drying the substrate to the surface of the substrate. The substrate includes a center area where a rotation center of the substrate is present, an inner peripheral area present on an outer side of the center area, an outer peripheral area present on an outer side of the inner peripheral area, and a peripheral edge area present on an outer side of the outer peripheral area. The method includes: supplying the rinse liquid from the rinse liquid nozzle to the surface of the substrate when the rinse liquid nozzle is located in the center area, the inner peripheral area, or the outer peripheral area; stopping supplying the rinse liquid from the rinse liquid nozzle to the surface of the substrate when the rinse liquid nozzle is located in the peripheral edge area; setting concentration of a drying component included in the drying gas supplied from the drying gas nozzle to the surface of the substrate higher when the drying gas nozzle is located in the inner peripheral area or the outer peripheral area compared with when the drying gas nozzle is located in the center area; setting the concentration of the drying component included in the drying gas supplied from the drying gas nozzle to the surface of the substrate to zero when the drying gas nozzle is located in the peripheral edge area; supplying the drying gas from the drying gas nozzle to the surface of the substrate when the drying gas nozzle is located in the center area, the inner peripheral area, or the outer peripheral area; and not changing a flow rate of the drying gas supplied from the drying gas nozzle to the surface of the substrate when the drying gas nozzle is located in the peripheral edge area.

With this method as well, as in the device explained above, when the drying gas nozzle reaches the position of the peripheral edge area of the substrate, the supply of the rinse liquid from the rinse liquid nozzle to the surface of the substrate is stopped, the concentration of the drying component (IPA) included in the drying gas supplied from the drying gas nozzle to the surface of the substrate is set to zero, and the flow rate of the drying gas is not changed. Consequently, it is possible to suppress occurrence of a defect (a defect having the defect size D of 20 nm or less) in the peripheral edge area (an edge portion) of the substrate where defect occurrence tends to be a problem. Therefore, it is possible to provide a more improved substrate drying method that suppresses occurrence of a micro size defect in the entire substrate surface.

According to the present invention, it is possible to provide a more improved substrate drying device and a more improved substrate drying method for suppressing occurrence of a micro size defect (for example, a defect having a defect size of 20 nm or less) on the surface of a substrate.

BRIEF DESCRIPTION OF THE DRAWINGS

FIG. 4 is an explanatory diagram of an example showing changes in rinse liquid, IPA concentration, a gas amount, and substrate rotating speed in a substrate drying method in the embodiment of the present invention;

FIG. 5 is an explanatory diagram of action and effects of suppression of defect occurrence in the embodiment of the present invention;

FIG. 6 is an explanatory diagram of an example showing changes (another example) of the rinse liquid, the IPA concentration, the gas amount, and the substrate rotating speed in the substrate drying method in the embodiment of the present invention;

FIG. 7 is an explanatory diagram of an example showing changes (another example) of the rinse liquid, the IPA concentration, the gas amount, and the substrate rotating speed in the substrate drying method in the embodiment of the present invention;

DETAILED DESCRIPTION OF THE PREFERRED EMBODIMENTS

A substrate drying device and a substrate drying method in an embodiment of the present invention are explained below with reference to the drawings. In this embodiment, a substrate drying device and a substrate drying method used for drying a substrate such as a semiconductor wafer are illustrated.

Figure 1:
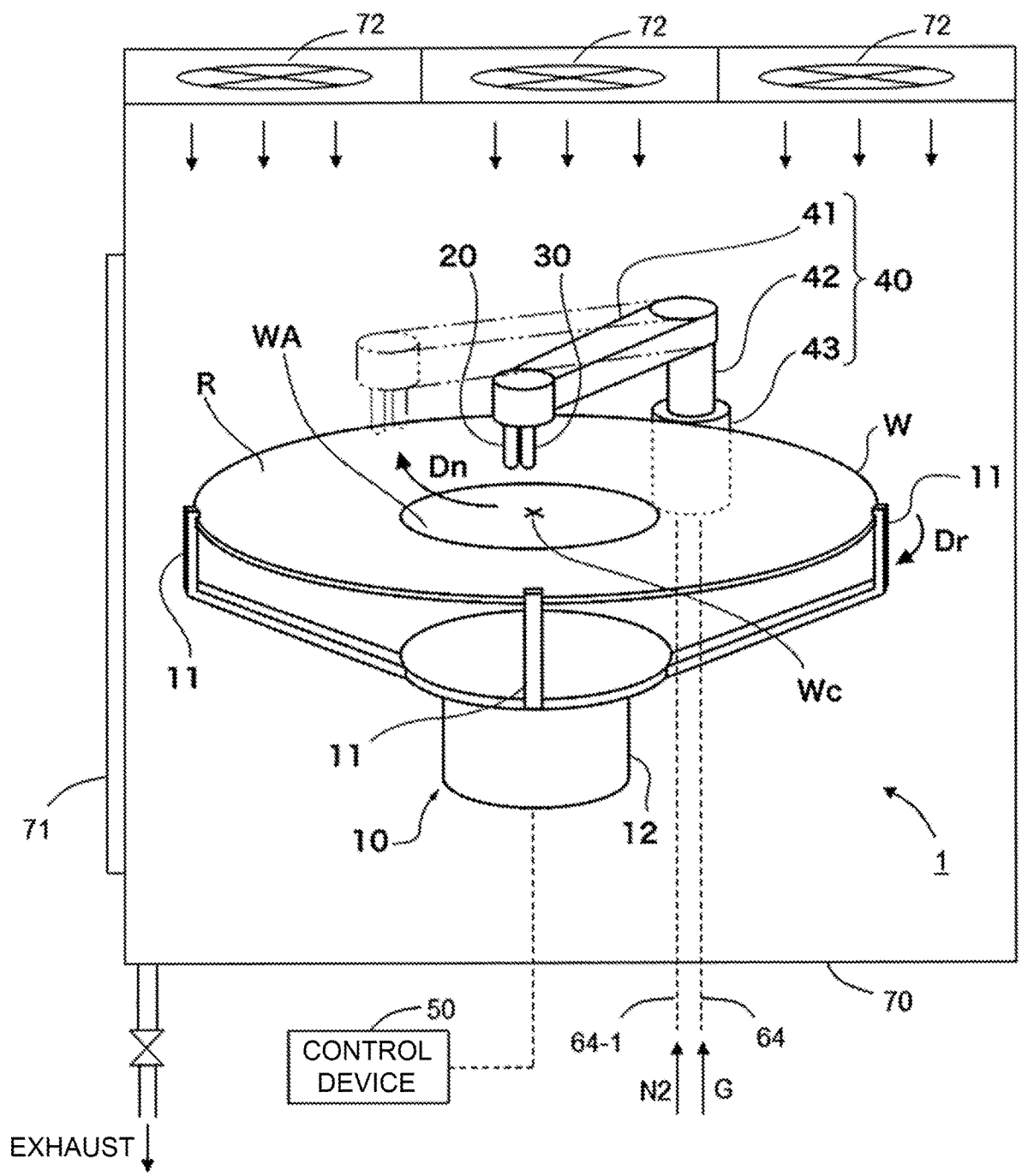
FIG. 1 is a perspective view showing an example of a substrate drying device according to an embodiment of the present invention.

A configuration of the substrate drying device in the embodiment of the present invention is explained with reference to the drawings. FIG. 1 is a perspective view of the substrate drying device in this embodiment. A substrate drying device 1 includes a rotating mechanism 10 that supports (or holds) a substrate W to be treated and, then, rotates the substrate W, a rinse water nozzle 20 functioning as a rinse liquid nozzle, a drying gas nozzle 30 that supplies a drying gas G (gas G for drying a target object) including at least IPA vapor to the substrate W, a moving mechanism 40 that moves the rinse water nozzle 20 and the drying gas nozzle 30 in parallel to the surface of the substrate W, and a control device 50 that controls an operation of the substrate drying device 1 including the rotating mechanism 10 and the moving mechanism 40. A rotating mechanism 10 as shown in FIG. 1 is act as a substrate holding unit. In other embodiment, vacuum chucking plate for suck the surface of the substrate or plural grippers for holding a substrate can be employed as a substrate holding unit.

The substrate drying device 1 includes a treatment container 70. The rotating mechanism 10 that supports the substrate, the rinse water nozzle 20, the drying gas nozzle 30, and the moving mechanism 40 are housed in the treatment container 70. A carry-in/out port 71 for carrying in or carrying out the substrate W is formed in a sidewall of the treatment container 70. Annular exhaust ducts 72 are provided in an upper part of the treatment container 70. An exhaust port 73 is provided in a lower part of the treatment container 70. Gas for ventilation is supplied from the exhaust ducts 72 and discharged from the exhaust port 73, whereby a downflow is formed in the treatment container 70. In an embodiment, the control device 50 and a drying gas generation device 60 explained below, which are components of the substrate drying device 1, are provided on the outside of the treatment container 70.

The rinse water nozzle 20 is a device that supplies rinse water R functioning as rinse liquid to the substrate W. In this embodiment, the moving mechanism 40 also functions as a rinse liquid nozzle moving mechanism and a drying gas nozzle moving mechanism. The substrate W to be treated is typically a semiconductor substrate (a size of which is typically 200 mm or 300 mm), which is a material for semiconductor element manufacturing, and is formed in a disk shape. A circuit is formed on one surface of the substrate W (this surface is referred to as "front surface WA") and a circuit is not formed on the other surface (a rear surface). Note that, as another embodiment, the semiconductor substrate used as the substrate W may be a substrate, for example, a silicon wafer on which a circuit surface is not formed. A compound semiconductor such as GaAs, SiC, or GaN may be used.

The rotating mechanism 10 includes chuck claws 11 and a rotation driving shaft 12. A plurality of chuck claws 11 are provided to grasp the outer peripheral end portion (an edge portion) of the substrate W and hold the substrate W. The chuck claws 11 are respectively connected to the rotation driving shaft 12 to be able to horizontally hold the surface of the substrate W. In this embodiment, the substrate W is held by the chuck claws 11 such that the front surface WA faces upward. The rotation driving shaft 12 is configured to be able to rotate around an axis extending perpendicularly to the surface of the substrate W and able to rotate the substrate W in a substrate rotation direction Dr in a horizontal plane according to rotation around the axis of the rotation driving shaft 12. Instead of this configuration, as the rotating mechanism 10 adaptable as another embodiment of the present invention, a disk formed in a disk shape having size corresponding to a substrate and provided with a plurality of holes communicating with a vacuum source on a placing surface associated with the vicinity of a substrate center to chuck the substrate in vacuum and a motor mechanism connected to a rotation axis of the disk may be provided. The substrate W may be held by the disk and rotatably supported.

In order to avoid occurrence of a defect such as a water mark due to drying of liquid on the front surface WA of the substrate W from a droplet state, the rinse water nozzle 20 is a nozzle (a tubular device that jets fluid from a thin hole at the distal end) that supplies, in a state of a water current (a rinse water current), rinse water R for covering the upper surface of the substrate W with a liquid film to the substrate W. The rinse water R is typically pure water. However, deionized water from which dissolved salt and dissolved organisms are removed, carbon dioxide gas dissolved water, or function water such as ozone water, hydrogen water, or electrolytic ion water may be used. The deionized water is desirably used from the viewpoint of eliminating the dissolved salt and the dissolved organisms that cause water mark occurrence. Whereas occurrence of static electricity involved in movement of the rinse water R on the substrate W due to rotation of the substrate W can attract foreign matters, the carbon dioxide gas dissolved water is desirably used from the viewpoint of raising conductivity of the rinse water R to suppress electrification. In an embodiment, in the case of a substrate including a specific metal component, the use of the carbon dioxide gas dissolved water can be a cause of defect occurrence because corrosion of the substrate is accelerated. Therefore, when such a problem is concerned, as the rinse water R, the carbon dioxide gas dissolved water may be used as first rinse water R1 and the deionized water (DIW) may be used as rinse water R2 used next.

The drying gas nozzle 30 is a nozzle that supplies isopropyl alcohol (hereinafter simply referred to as IPA) to a film of the rinse water R covering the front surface WA of the substrate W and supplying, to the substrate W, in a state of a gas current (a drying gas current), a drying gas G that moves away the film of the rinse water R. The drying gas G is typically a gas obtained by mixing vapor of IPA in an inert gas such as nitrogen or argon functioning as a carrier gas. However, the drying gas G may be the IPS vapor itself and includes at least the IPA vapor.

The substrate drying device 1 in this embodiment includes a device that generates the drying gas G. In the device that generates the drying gas G, IPA liquid is stored, in a sealed state, in a cylindrical container (not shown) made of metal such as stainless steel. An inflow pipe (not shown) for feeding an inert gas into the container and an lead-out pipe (not shown) for leading the inert gas contained in the IPA vapor from the container to the drying gas nozzle 30 pierce through the upper end face of the cylindrical container. The end portion of the inflow pipe present in the container is sunk in the IPA liquid. On the other hand, the end portion of the lead-out pipe present in the container is located in a portion filled with gas above the IPA liquid and is not sunk in the IPA liquid. In the container, a contact-type liquid surface sensor for maintaining a liquid level of the IPA liquid in the container within a predetermined range is provided. The liquid surface sensor detects a high level or a low level of the IPA liquid in the container, starts a pump (not shown) to supply the IPA liquid into the container when detecting the low level, and stops the pump to stop the supply of the IPA liquid into the container when detecting the high level.

To contain the IPA vapor in the drying gas current blown out from the drying gas nozzle 30, the inert gas is blown into the IPA liquid from the inflow pipe to cause the IPA liquid to bubble. Then, the IPA vapor is saturated by the inert gas and accumulates in the container above the IPA liquid. The IPA vapor is led out from the container by the lead-out pipe and led to the drying gas nozzle 30. Adjusting a content of the IPA vapor in the inert gas blown out from the drying gas nozzle 30 is typically realized by mixing the inert gas, from another line, in the inert gas saturated with the IPA vapor led to the drying gas nozzle 30 and diluting the inert gas.

Figure 2:
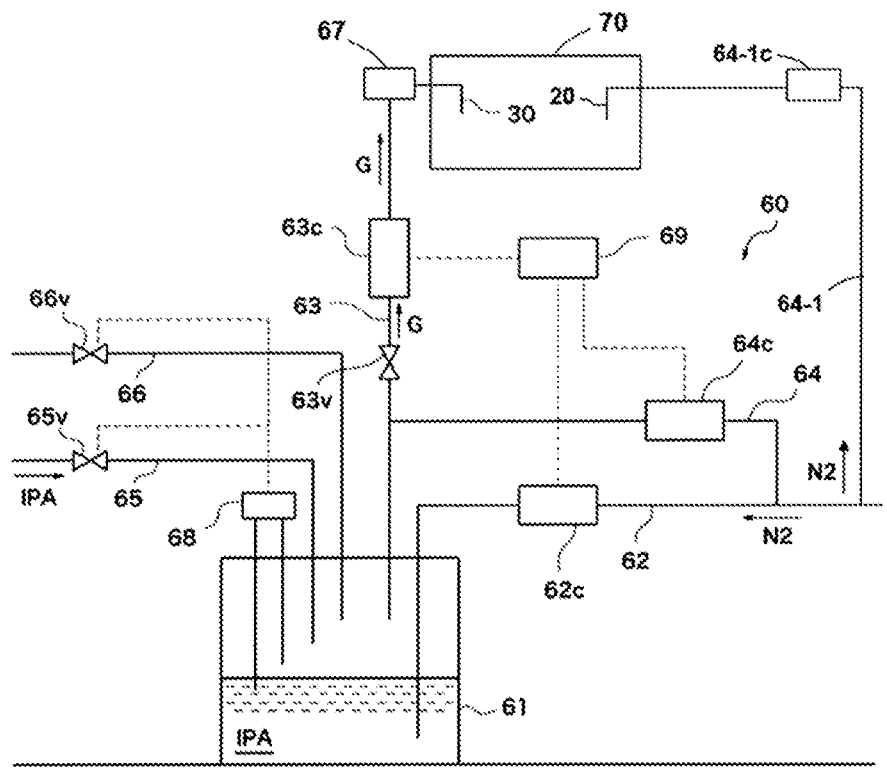
FIG. 2 is an explanatory diagram of a configuration of a drying gas generation device in the embodiment of the present invention.

A specific example of the device that generates the drying gas G is explained with reference to FIG. 2. FIG. 2 is an explanatory diagram showing the configuration of a drying gas generation device 60. The drying gas generation device 60 includes an airtight container 61 in which the IPA liquid is stored. An inflow pipe 62 for feeding a nitrogen gas N2 into the container 61 and a lead-out pipe 63 for leading out, from the container 61, the nitrogen gas N2 contained in the IPA vapor pierce through the upper end face of the container 61. In the container 61, the end portion of the inflow pipe 62 is sunk in the IPA liquid and the end portion of the lead-out pipe 63 is not sunk in the IPA liquid. A mass flow controller (hereinafter referred to as "MFC") 62c is inserted into and disposed in the inflow pipe 62 and an MFC 63c is inserted into and disposed in the lead-out pipe 63. The MFCs 62c and 63c are devices that adjust a flow rate of fluid, excellent in responsiveness and stability, and configured to be able to instantaneously control the flow rate to a predetermined flow rate value. A valve 63v is inserted into and disposed in the lead-out pipe 63 further on the upstream side than the MFC 63c. The inflow pipe 62 further on the upstream side than the MFC 62c and the lead-out pipe 63 further on the upstream side than the valve 63v communicate via a bypass pipe 64. A MFC 64c is inserted into and disposed in the bypass pipe 64. The MFC 62c, 63c, and 64c are respectively connected to an IPA-concentration detecting unit 69 by signal cables and configured to be able to adjust a flow rate of fluid passing through the inflow pipe 62, the lead-out pipe 63, and the bypass pipe 64 such that a flow rate and IPA concentration of the drying gas G supplied to the drying gas nozzle 30 are desired values. In this device, the inflow pipe 62 for the nitrogen gas N2 branches to form a bypass pipe 64-1. The bypass pipe 64-1 is connected to the rinse water nozzle 20 via an MFC 64-1c.

In the container 61, a liquid surface sensor 68 for maintaining a liquid level of the IPA liquid in the container 61 within a predetermined range is provided. An IPA supply pipe 65 for leading the IPA liquid into the container 61 and a gas releasing pipe 66 for releasing gas in an upper part in the container 61 pierce through the upper end face of the container 61. End portions of both of the IPA supply pipe 65 and the gas releasing pipe 66 are located above the IPA liquid surface in the container 61. An IPA supply valve 65v is inserted into and disposed in the IPA supply pipe 65. A gas releasing valve 66v is inserted into and disposed in the gas releasing pipe 66. The IPA supply valve 65v and the gas releasing valve 66v are respectively connected to the liquid surface sensor 68 by signal cables. When the liquid surface sensor 68 detects a low liquid level, the IPA supply valve 65v is opened and the IPA liquid is supplied to the container 61. When the liquid surface sensor 68 detects a high liquid level, the IPA supply valve 65v is closed to stop the supply of the IPA liquid into the container 61. The gas releasing valve 66v is also opened or closed in association with the opening and closing of the IPA supply valve 65v. The IPA liquid is smoothly supplied into the container 61.

In the drying gas generation device 60 configured as explained above, when the drying gas G is generated, the nitrogen gas N2 is led into the inflow pipe 62 and/or the bypass pipe 64 in a state in which the IPA supply valve 65v and the gas releasing valve 66v are closed. The nitrogen gas N2 led into the container 61 via the inflow pipe 62 is blown into the IPA liquid in the container 61 to cause the IPA liquid to bubble and vaporizes the IPA liquid. A mixed gas of the IPA vapor and the nitrogen gas N2 is generated above the IPA liquid surface. The mixed gas flows in the lead-out pipe 63 toward the drying gas nozzle 30. While the mixed gas is flowing, the nitrogen gas N2 merges the mixed gas from the bypass pipe 64 according to necessity. The mixed gas changes to the drying gas G with IPA concentration adjusted and is supplied to the drying gas nozzle 30. In this way, the IPA concentration in the drying gas G is adjusted to desired concentration with high responsiveness.

Further, a filter 67 for filtering drying gas is provided in the drying gas generation device 60 in this embodiment. A defect size D allowed in a defect test after drying of a substrate is set to 20 nm or less and a ratio D/F of the defect size D and a filter size F of the filter 67 is set to a value equal to or larger than 4. For example, the ratio D/F of the defect size D and the filter size F of the filter 67 is set to a value such as 4, 6, 13, 20, and 67 (see FIG. 5). Referring back to FIG. 1, the explanation of the configuration of the substrate drying device 1 is continued.

The moving mechanism 40 includes a movable arm 41, a movable shaft 42, and a driving source 43. The movable arm 41 is a member that has length larger than the radius of the substrate W and to which the rinse water nozzle 20 and the drying gas nozzle 30 are attached. The movable shaft 42 is a bar-like member that transmits power of the driving source 43 to the movable arm 41. One end of the movable shaft 42 is connected to one end of the movable arm 41 such that the longitudinal direction of the movable shaft 42 is orthogonal to the longitudinal direction of the movable arm 41. The other end of the movable shaft 42 is connected to the driving source 43. The driving source 43 is a device that turns the movable shaft 42 around an axis. The movable shaft 42 is set to extend in the vertical direction on the outer side of the substrate W. The movable arm 41 is configured such that a drying gas current discharged from the drying gas nozzle 30 attached to the opposite side of a connection end to the movable shaft 42 can collide with the rotation center of the substrate W. The moving mechanism 40 is configured such that, when the driving source 43 is operated, the movable arm 41 moves in the radial direction of the substrate W via the movable shaft 42 and the rinse water nozzle 20 and the drying gas nozzle 30 also move in the radial direction of the substrate W according to the movement of the movable arm 41.

The control device 50 includes a process controller including a microprocessor (a computer), a user interface, and a storing unit. Constituent members configuring elements of a substrate drying device are electrically connected to the process controller and can be controlled. The storing unit is electrically connected to the process controller. In the storing unit, a control program for realizing, with control of the process controller, various kinds of treatment executed by the substrate drying device, a recipe for carrying out predetermined treatment according to treatment conditions, and other various databases are recorded. In the storing unit, the numbers of revolutions of the substrate W at respective execution timings, a flow rate of a rinse water current discharged from the rinse water nozzle 20, a flow rate (a gas amount) of a drying gas current discharged from the drying gas nozzle 30, and concentration of IPA are stored for each recipe to correspond to a time from a tact start to a tact end of substrate drying treatment. In the storing unit, a recording medium such as computer-readable hard disk, a flexible disk, a DVD, a CD-ROM, or a memory card is stored. The recipe is recorded in the recording medium. Alternatively, the recipe may be read out as data from a Cloud server or the like. The user interface is connected to the process controller and configured from an input tablet, a display including a display screen, or the like with which an operator can input commands for managing various constituent members of the substrate drying device.

The control device 50 is connected to the rotation driving shaft 12 of the rotating mechanism 10 by a signal cable and configured to be able to adjust rotating speed of the substrate W by adjusting rotating speed of the rotation driving shaft 12. The control device 50 is configured to be able to adjust a flow rate of a rinse water current discharged from the rinse water nozzle 20. The control device 50 is configured to be able to adjust a flow rate (a gas amount) of a drying gas current discharged from the drying gas nozzle 30 and able to adjust concentration of IPA that can be contained in the drying gas G. The control device 50 is connected to the driving source 43 of the moving mechanism 40 by a signal cable and configured to be able to adjust moving speed of the movable arm 41 by adjusting rotating speed of the movable shaft 42 by the driving source 43.

Action of the substrate drying device 1 is explained continuously with reference to FIG. 1. The action of the substrate drying device 1 is one mode of a substrate drying method according to the embodiment of the present invention. However, the substrate drying method according to the embodiment of the present invention may be configured to be executed by a device other than the substrate drying device 1. Operations of members in the following explanation are controlled by the control device 50. In a Front End process for fabricating semiconductor wafer, a chemical mechanical polishing (CMP) process is performed and wet cleaning is performed by chemical or the like. The substrate W in a state in which a liquid component such as chemical at the cleaning time remains on the surface (a state before being dried) is grasped by the chuck claws 11 of the rotating mechanism 10. Wet cleaning treatment before a drying process may be performed on the same rotating mechanism 10 as the rotating mechanism 10 used when drying treatment is to be performed. When the substrate W to be subjected to the drying treatment is held by the rotating mechanism 10, the movable arm 41 is moved until a discharge port of the rinse water nozzle 20 reaches a position opposed to a portion slightly deviating from a rotation center Wc of the front surface WA of the substrate W. At this time, the drying gas nozzle 30 is located in a place where, while the rotation center Wc of the front surface WA is present within a collision range, which is a range in which the drying gas current collides with the front surface WA, the center of gravity of the collision range is further on an upstream side in a nozzle moving direction Dn than the rotation center Wc of the front surface WA. Note that the "collision range" is a range in which the drying gas current collides with the front surface WA when it is assumed that the rinse water R is absent on the front surface WA (an outer edge of an axial rectangular cross section of the drying gas current at the time when the cross section is projected onto the front surface WA). The nozzle moving direction Dn is a direction from the rotation center Wc side of the substrate W to the outer peripheral side in which the drying gas current moves when the front surface WA is dried.

When the movable arm 41 moves to the position described above, a rinse water current is discharged from the rinse water nozzle 20 such that the rinse water R is supplied to the front surface WA of the substrate W. When the supply of the rinse water current to the front surface WA is started, the rotation driving shaft 12 is rotated, whereby the substrate W rotates in a horizontal plane. At this time, rotating speed of the substrate W is gradually increased. However, from the viewpoint of making it possible to cover the front surface WA with a film of the rinse water R without the rinse water R scattering even if the front surface WA is hydrophobic, it is preferable to set acceleration to 300 rpm or less per one second. On the other hand, from the viewpoint of improving throughput, the acceleration is desirably set as large as possible within a range in which the front surface WA can be covered with a film of the rinse water R.

When the front surface WA is covered with the rinse water R and the rotating speed of the substrate W increases to a predetermined value, the drying gas current is supplied from the drying gas nozzle 30 to the front surface WA. Since IPA included in the drying gas current is generally bipolar, even if the front surface WA is hydrophobic, the IPA is uniformly wet without unevenness (extended wetting). Since solubility of the IPA with respect to water is infinite, IPA vapor is quickly dissolved in the water adhering to the front surface WA. If the IPA vapor is water droplets, the IPA changes to liquid droplets mixed with the water droplets. The supply of the rinse water current to the front surface WA is continues even if the supply of the drying gas current to the front surface WA is started. The drying gas current is supplied to the front surface WA, whereby, even near the rotation center Wc where a centrifugal force working on the rinse water R on the front surface WA is small, the rinse water R in a portion to which the drying gas G is supplied is removed and a dried region appears on the front surface WA. When the supply of the drying gas current to the front surface WA is started, the movable arm 41 is moved in the nozzle moving direction Dn. According to the movement of the movable arm 41, a position where the rinse water current collides with the front surface WA and a position where the drying gas current collides with the front surface WA move in the nozzle moving direction Dn. Since the drying gas nozzle 30 before the movable arm 41 starts operation is located in a place where the center of gravity of the collision range of the drying gas current is further on the upstream side in the nozzle moving direction Dn than the rotation center Wc of the front surface WA, the center of gravity of the collision range passes the rotation center Wc according to the movement of the movable arm 41.

The movable arm 41 moves from the rotation center Wc to the outer periphery of the substrate W while the rinse water current and the drying gas current are supplied to the front surface WA, whereby the boundary between the rinse water R and the drying gas G concentrically gradually expands and the dried region on the front surface WA is gradually enlarged. At this time, in the boundary between the rinse water R and the drying gas G, the drying gas G is blown against the rinse water R, whereby the IPA in the drying gas G is dissolved in the rinse water R and a decrease in surface tension of the rinse water R occurs. Since the concentration of the IPA dissolved in the rinse water R is lower further away from a contact position of the drying gas current, a gradient lower on the upstream side and higher on the downstream side in the nozzle moving direction Dn occurs in the surface tension of the rinse water R. According to the gradient of the surface tension, a Marangoni force with which the rinse water R is attracted to a direction in which the surface tension is large from a direction in which the surface tension is small acts. In addition, according to the rotation of the substrate W, a centrifugal force with which the rinse water R is attracted to the outer periphery side of the substrate W from the rotation center Wc side is applied. The rinse water R is appropriately removed from the front surface WA by an interaction of these forces. That is, the rinse liquid is moved to the outer periphery side by the centrifugal force and the Marangoni force to gradually expand the drying region on the substrate from the center to the outer periphery and finally dry the entire substrate surface. With the sheet-type IPA drying explained above, it is possible to suppress occurrence of a defect such as a water mark on the surface of the substrate and effectively perform drying treatment even for the hydrophobic front surface WA. Note that it goes without saying that the sheet-type IPA drying can be applied to a front surface of a hydrophilic substrate as well.

When the movable arm 41 reaches the outer periphery of the substrate W, the supply of the rinse water current to the front surface WA is stopped and a supply amount of the drying gas current is reduced. At this time, the supply of the rinse water current to the front surface WA is stopped first and, subsequently, the supply amount of the drying gas current is reduced. Thereafter, the rotating speed of the substrate W is increased (in this embodiment, increased to approximately 800 to 2000 rpm) and the liquid droplets remaining at the outer peripheral end portion (the edge portion) and the rear surface of the substrate W are removed by the centrifugal force. Then, the drying process ends and, after the rotation of the substrate W is stopped, the substrate W is carried out from the rotating mechanism 10.

Figure 3:
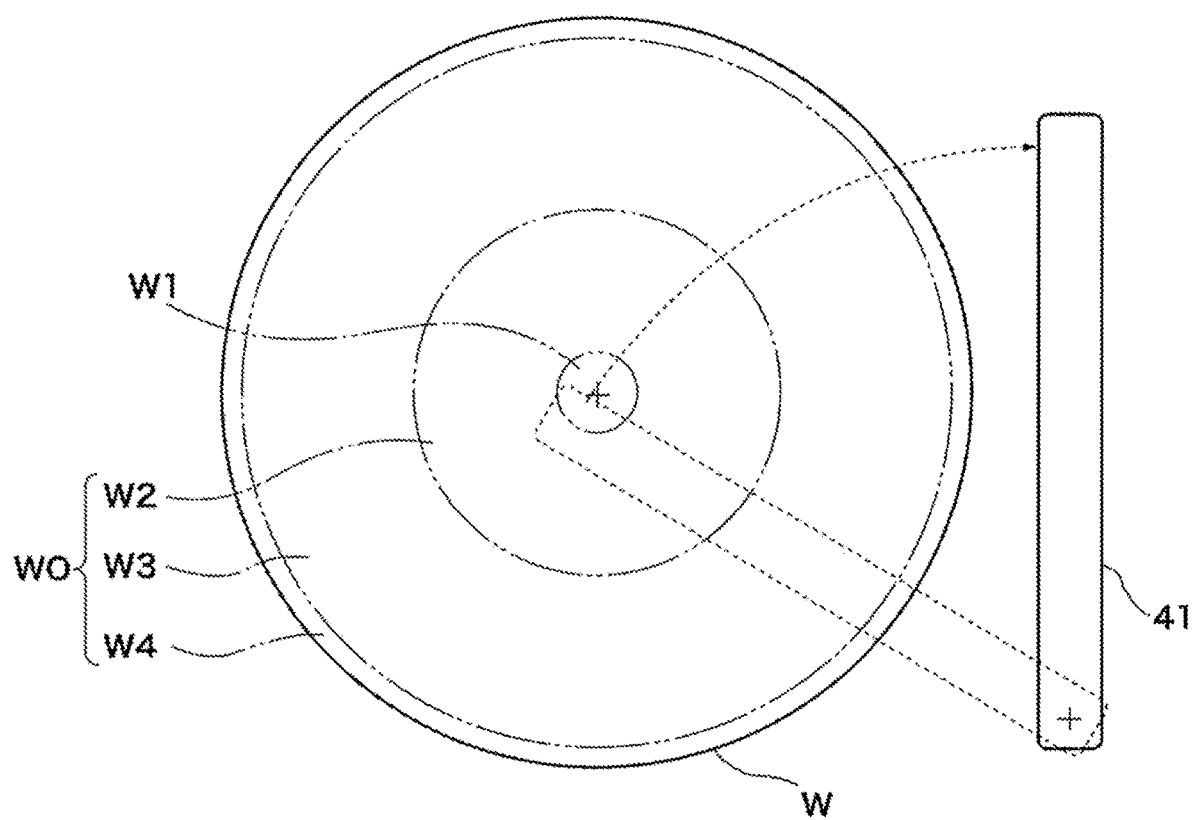
FIG. 3 is an explanatory diagram showing an example of areas on the surface of a substrate.

FIG. 3 is a plan view showing a distinguished range of the front surface WA of the substrate W. First, the front surface WA is distinguished into a center area W1 and an outer side area WO. The center area W1 is a range in which the rotation center Wc of the substrate W is present in the collision range (the range in which the drying gas current collides with the front surface WA). The center area W1 is typically a range on the inner side of an imaginary circle drawn with the rotation center Wc as a center and the length of the diameter of the collision range as a radius. The outer side area WO is a region further on the outer side than the center area W1. The outer side area WO is further distinguished into an inner peripheral area W2, an outer peripheral area W3, and a peripheral edge area W4 in order from the rotation center Wc of the substrate W toward the outer peripheral edge portion. The inner peripheral area W2 is a range on the inner side of an imaginary circle drawn with the rotation center Wc as a center and approximately half length of the radius of the substrate W as a radius and on the outer side of the center area W1. The outer peripheral area W3 is a range on the outer side of the inner peripheral area W2 and on the inner side of the peripheral edge area W4. The peripheral edge area W4 is a range further on the outer side than a track obtained by rotating, around the rotation center Wc, a position of the drying gas current reaching a position where the supply of the rinse water current to the front surface WA is stopped (typically, reaching the outer peripheral end portion) in a situation in which the rinse water current (see FIG. 1) and the drying gas current (see FIG. 1) are moving in the radial direction of the substrate W (the nozzle moving direction Dn).

Figures 8, 9:
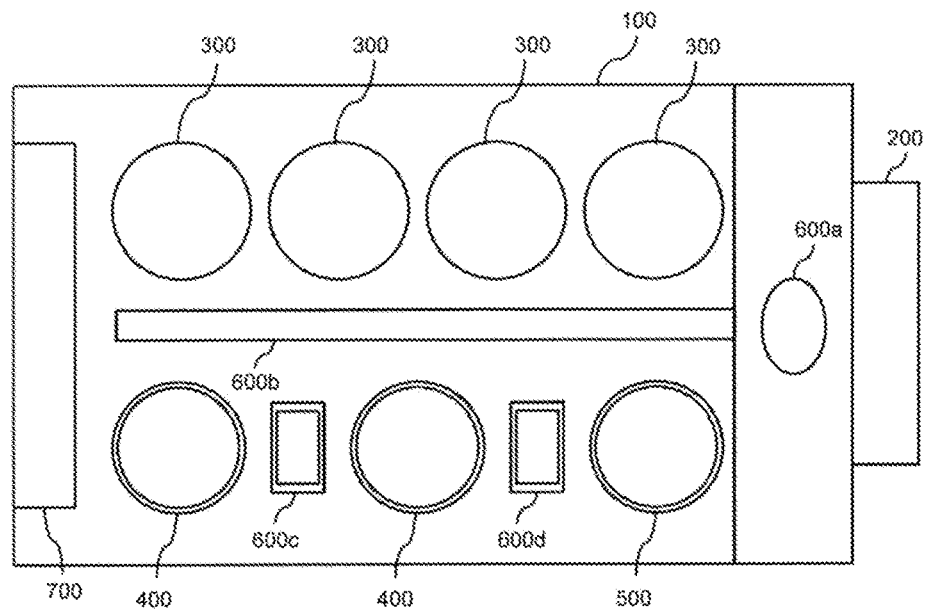
FIG. 8 is an explanatory diagram of an example showing changes (another example) of the rinse liquid, the IPA concentration, the gas amount, and the substrate rotating speed in the substrate drying method in the embodiment of the present invention.
FIG. 9 is a schematic top view of a substrate treatment apparatus in which the substrate drying device in the embodiment of the present invention is used.

The substrate drying device 1 in this embodiment can be applied to a substrate treatment apparatus. FIG. 9 is a schematic top view of the substrate treatment apparatus. The substrate treatment apparatus processes various substrates in manufacturing processes for magnetic films in a semiconductor wafer having a diameter of 300 mm or 450 mm, a flat panel, image sensors such as a CMOS (Complementary Metal Oxide Semiconductor) or a CCD (Charge Coupled Device), and an MRAM (Magneto-resistive Random Access Memory).

The substrate treatment apparatus includes a substantially rectangular housing 100, a load port 200 on which a substrate cassette storing a large number of substrates is placed, one or a plurality of (four in FIG. 1) substrate polishing devices 300, one or a plurality of (two in FIG. 1) substrate cleaning devices 400, a substrate drying device 500, conveying mechanisms 600a to 600d, and a control unit 700. The substrate drying device 1 in this embodiment can be used as the substrate drying device 500. In that case, the control device 50 of the substrate drying device 1 can be configured as the control unit 700.

The load port 200 is disposed adjacent to the housing 100. An open cassette, an SMIF (Standard Mechanical Interface) pod, or an FOUP (Front Opening Unified Pod) can be loaded on the load port 200. The SMIF pod and the FOUP are sealed containers that can keep an environment independent from an external space by housing the substrate cassette on the inside and covering the substrate cassette with a partition wall. Examples of a substrate include a semiconductor wafer.

The substrate polishing device 300 that polishes a substrate, the substrate cleaning device 400 that cleans the substrate after the polishing, and the substrate drying device 500 that dries the substrate after the cleaning are housed in the housing 100. The substrate polishing device 300 is arrayed along the longitudinal direction of the substrate treatment apparatus. The substrate cleaning device 400 and the substrate drying device 500 are also arrayed along the longitudinal direction of the substrate treatment apparatus.

The conveying mechanism 600a is disposed in a region surrounded by the load port 200, the substrate polishing device 300 located on the load port 200 side, and the substrate drying device 500. The conveying mechanism 600b is disposed in parallel to the substrate polishing device 300, the substrate cleaning device 400, and the substrate drying device 500. The conveying mechanism 600a receives a substrate before polishing from the load port 200 and delivers the substrate to the conveying mechanism 600b and receives, from the conveying mechanism 600b, a substrate after drying taken out from the substrate drying device 500.

The conveying mechanism 600c that delivers a substrate between the two substrate cleaning devices 400 is disposed between the substrate cleaning devices 400. The conveying mechanism 600d that delivers a substrate between the substrate cleaning device 400 and the substrate drying device 500 is disposed between the substrate cleaning device 400 and the substrate drying device 500.

Further, the control unit 700 that controls movements of devices of the substrate treatment apparatus is disposed on the inside of the housing 100. In the following explanation, the control unit 700 is disposed on the inside of the housing 100. However, not only this, but the control unit 700 may be disposed on the outside of the housing 100.

Subsequently, a substrate cleaning method in this embodiment is explained with reference to FIG. 4. FIG. 4 is a time chart showing supply and stop of the rinse water R, a change in IPA concentration in a drying gas current, a change in a flow rate (a gas amount) of the drying gas current, and a change in rotating speed of the substrate W. Note that signs W1 to W4 described on the horizontal axis indicate regions of the front surface WA distinguished for convenience. In FIG. 4, to facilitate understanding, W1 to W4 are equally divided. However, this does not mean that time periods required for drying the areas are equal.

First, control of the supply and stop of the rinse water R is explained. As shown in FIG. 4, in this embodiment, the rinse water R is supplied to the front surface WA of the substrate W when the center area W1, the inner peripheral area W2, and the outer peripheral area W3 are dried. The supply of the rinse water R to the front surface WA of the substrate W is stopped when the peripheral edge area W4 is dried.

Subsequently, control of the IPA concentration in the drying gas current is explained. As shown in FIG. 4, in this embodiment, when the center area W1 is dried, the IPA concentration in the drying gas current is maintained as low concentration (for example, lower than 2 mol %). When the inner peripheral area W2 and the outer peripheral area W3 are dried, the IPA concentration in the drying gas current is maintained at high concentration (for example, 2 mol % to 20 mol %). When the peripheral edge area W4 is dried, the IPA concentration in the drying gas current is set to zero (0 mol %).

Subsequently, control of the flow rate (the gas amount) of the drying gas current is explained. As shown in FIG. 4, in this embodiment, when the center area W1, the inner peripheral area W2, and the outer peripheral area W3 are dried, the flow rate (the gas amount) of the drying gas current is maintained at a large flow rate (for example, 0.5 litter/minute to 20 litters/minute). When the peripheral edge area W4 is dried, the flow rate (the gas amount) of the drying gas current is maintained at a small flow rate (for example, a flow rate of 0.25 litter/minute to 10 litters/minute, which is half of the large flow rate). The flow rate (the gas amount) of the drying gas current means a total gas amount of the IPA gas and the nitrogen gas N2. Therefore, for example, if the IPA concentration increases (if a gas amount of the IPA gas increases) when the inner peripheral area W2 is dried, the flow rate (a total gas amount) of the drying gas current is maintained constant by reducing a gas amount of the nitrogen gas N2 by the increase in the IPA concentration.

Lastly, control of the rotating speed of the substrate W is explained. As shown in FIG. 4, in this embodiment, when the center area W1, the inner peripheral area W2, and the outer peripheral area W3 are dried, the rotating speed of the substrate W is maintained at predetermined low rotating speed (for example, 100 rpm to 500 rpm). When the peripheral edge area W4 is dried, the rotating speed of the substrate W is increased to predetermined high rotating speed (for example, 800 rpm to 2000 rpm) at rotation acceleration equal to or higher than predetermined high rotation acceleration (500 rpm/second or higher, for example, 1000 rpm/second). The high rotating speed can be called target rotating speed.

With the substrate drying device 1 in this embodiment explained above, even when the defect size D allowed in a defect test after drying of the substrate W is 20 nm or less, it is possible to suppress occurrence of a defect (a defect with the defect size D of than 20 nm or less) by setting a pore distribution and a pore diameter of the filter 67 such that a ratio of the defect size D and the filter size F of the filter 67 (the filter 67 for filtering the drying gas for drying the substrate) is 4 or more as shown in FIG. 5.

In the recipe in this embodiment, as shown in FIG. 4, when the drying gas nozzle 30 reaches the position of the peripheral edge area W4 of the substrate W, the supply of the rinse water R from the rinse water nozzle 20 to the front surface WA of the substrate W is stopped, the concentration of the IPA included in the drying gas supplied from the drying gas nozzle 30 to the front surface WA of the substrate W is set to zero, and the flow rate (the gas amount) of the drying gas is reduced. Consequently, it is possible to suppress occurrence of a defect (a defect with the defect size D of 20 nm or less), in particular, in the peripheral edge area W4 (the edge portion) of the substrate W where defect cocurrent tends to be a problem. Therefore, it is possible to realize a more improved substrate drying treatment method for suppressing occurrence of a micro size defect in the entire substrate.

In the recipe in this embodiment, as shown in FIG. 4, when the supply of the rinse water R is stopped, by increasing the rotating speed of the substrate to predetermined target rotating speed (for example, 800 rpm to 2000 rpm) at rotation acceleration equal to or higher than predetermined rotation acceleration (500 rpm/second or higher, for example, 1000 rpm/second), it is possible to suppress occurrence of a defect (a defect with the defect size D of 20 nm or less) in the peripheral edge area W4 (the edge portion) of the substrate W.

The embodiment of the present invention is explained above by the illustration. However, the scope of the present invention is not limited to the embodiment and can be changed or modified according to a purpose within the scope described in the claims.

For example, in an example shown in FIG. 4, when the inner peripheral area W2 and the outer peripheral area W3 are dried, the IPA concentration in the drying gas current is maintained at high concentration (for example, 2 mol % to 20 mol %). However, as shown in FIG. 6, when the inner peripheral area W2 and the outer peripheral area W3 are dried, a recipe for gradually increasing the IPA concentration in the drying gas current may be used. In the example shown in FIG. 4, when the center area W1, the inner peripheral area W2, and the outer peripheral area W3 are dried, the flow rate (the gas amount) of the drying gas current is maintained at a large flow rate (for example, 0.5 litter/minute to 20 litters/minute). However, as shown in FIG. 6, when the center area W1, the inner peripheral area W2, and the outer peripheral area W3 are dried, a recipe for gradually increasing the flow rate (the gas amount) of the drying gas current may be used.

In the example shown in FIG. 4, when the peripheral edge area W4 is dried, the flow rate (the gas amount) of the drying gas current is reduced to a small flow rate (for example, a flow rate of 0.25 litter/minute to 10 litters/minute, which is half of the large flow rate). However, as shown in FIG. 7, when the drying gas nozzle 30 is located in the peripheral edge area W4, the flow rate of the drying gas supplied from the drying gas nozzle 30 to the front surface WA of the substrate W does not have be changed. In this case, since the IPA concentration is reduced (the gas amount of the IPA gas is reduced), the flow rate (a total gas amount) of the drying gas current is maintained constant by increasing the gas amount of the nitrogen gas N2 by the decrease in the IPA concentration. In this way as well, it is possible to suppress occurrence of a defect (a defect with the defect size D of 20 nm or less) in the peripheral edge area W4 (the edge portion) of the substrate W.

In an example shown in FIG. 7, when the inner peripheral area W2 and the outer peripheral area W3 are dried, the IPA concentration in the drying gas current is maintained at high concentration (for example, 2 mol % to 20 mol %). However, as shown in FIG. 8, when the inner peripheral area W2 and the outer peripheral area W3 are dried, the IPA concentration in the drying gas current may be gradually increased.

In the example shown in FIG. 7, when the center area W1, the inner peripheral area W2, and the outer peripheral area W3 are dried, the flow rate (the gas amount) of the drying gas current is maintained at a large flow rate (for example, 0.5 litter/minute to 20 litters/minute). However, as shown in FIG. 8, when the center area W1, the inner peripheral area W2, and the outer peripheral area W3 are dried, the flow rate (the gas amount) of the drying gas current may be gradually increased.

According to the embodiment explained above, in the substrate drying device that dries a substrate, it is possible to continuously perform a series of treatment on a plurality of substrates. It is possible to suppress occurrence of defects on substrates at continuous substrate drying treatment time while improving throughput.

As explained above, the substrate drying device according to the present invention has an effect that it is possible to suppress occurrence of a micro size defect (for example, a defect with a defect size of 20 nm or less). The substrate drying device is useful as, for example, a substrate drying device for a semiconductor wafer and the like.

| Reference Signs List | |
|---|---|
| 1 | Substrate drying device |
| 10 | Rotating mechanism |
| 11 | Chuck claw (substrate holding unit) |
| 12 | Rotation driving shaft (substrate rotating unit) |
| 20 | Rinse water nozzle (rinse liquid nozzle) |
| 30 | Drying gas nozzle |
| 40 | Moving mechanism |

| Reference Signs List (continued) | |
|---|---|
| 50 | Control device |
| 60 | Gas generator (gas generation device including a drying gas) |
| 67 | Filter |
| W | Substrate |
| WA | Front surface of the substrate |
| W1 | Center area |
| WO | Outer side area |
| W2 | Inner peripheral area |
| W3 | Outer peripheral area |
| W4 | Peripheral edge area |
| R | Rinse water |
| G | Drying gas |

What is claimed is:

1. A substrate drying device comprising:
   a substrate holding unit configured to hold a substrate;
   a gas generator configured to generate a drying gas including at least IPA vapor, the drying gas is for drying the substrate; and
   a drying gas nozzle configured to supply the drying gas to a surface of the substrate, wherein
   the gas generator further comprising a filter for filtering the drying gas; and wherein
   the filter has a filter size F that is set to enable the followings:
   (1) a defect size D allowed in a defect test after the drying of the substrate is set to 20 nm or less, and
   (2) 4 or more of a ratio of the defect size D over the filter size F.

* * * * *